US012353984B2

(12) United States Patent
Xi et al.

(10) Patent No.: US 12,353,984 B2
(45) Date of Patent: *Jul. 8, 2025

(54) HARDWARE-ASSISTED GRADIENT OPTIMIZATION USING STREAMED GRADIENTS

(71) Applicant: Microsoft Technology Licensing, LLC, Redmond, WA (US)

(72) Inventors: Jinwen Xi, Sunnyvale, CA (US); Bharadwaj Pudipeddi, San Jose, CA (US); Marc Tremblay, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 149 days.

This patent is subject to a terminal disclaimer.

(21) Appl. No.: 18/311,670

(22) Filed: May 3, 2023

(65) Prior Publication Data

US 2023/0274130 A1  Aug. 31, 2023

Related U.S. Application Data

(63) Continuation of application No. 16/827,367, filed on Mar. 23, 2020, now Pat. No. 11,681,905.

(51) Int. Cl.
*G06N 3/06* (2006.01)
*G06N 3/063* (2023.01)
(Continued)

(52) U.S. Cl.
CPC ............. *G06N 3/063* (2013.01); *G06N 3/084* (2013.01); *G06N 5/046* (2013.01); *G06N 20/00* (2019.01); *G11C 11/34* (2013.01)

(58) Field of Classification Search
CPC ...... G06N 3/063; G06N 3/0454; G06N 3/084; G06N 3/0445; G06N 20/00; G06N 5/046; G06N 3/045; G06N 3/044; G11C 11/34
See application file for complete search history.

(56) References Cited

U.S. PATENT DOCUMENTS 11,057,318 B1 * 7/2021 Matthews ............... H04L 45/56
2021/0103820 A1 * 4/2021 Ghosh .................... G06N 3/084
(Continued)

OTHER PUBLICATIONS

Ruder, "An overview of gradient descent optimization algorithms", Jun. 2017. (Previously supplied). (Year: 2017).*
(Continued)

*Primary Examiner* — Dave Misir
(74) *Attorney, Agent, or Firm* — Ranjeev Singh; Singh Law, PLLC

(57) ABSTRACT

Systems and methods related to hardware-assisted gradient optimization using streamed gradients are described. An example method in a system comprising a memory configured to store weights associated with a neural network model comprising L layers, where L is an integer greater than one, a gradient optimizer, and a plurality of workers is described. The method includes during a single burst cycle moving a first set of gradients, received from each of the plurality of workers, from at least one gradient buffer to the gradient optimizer and moving weights from at least one buffer, coupled to the memory, to the gradient optimizer. The method further includes during the single burst cycle writing back the new weights, calculated by the gradient optimizer, to the memory. The method further includes during the single burst cycle transmitting the new weights, from the gradient optimizer, to each of the plurality of workers.

20 Claims, 5 Drawing Sheets

(51) Int. Cl.
  *G06N 3/084*   (2023.01)
  *G06N 5/046*   (2023.01)
  *G06N 20/00*   (2019.01)
  *G11C 11/34*   (2006.01)

(56)          References Cited

U.S. PATENT DOCUMENTS

2021/0133583 A1*  5/2021  Chetlur .................. G06F 9/505
2021/0295168 A1*  9/2021  Xu ........................ G06N 5/046
2021/0357760 A1* 11/2021  Tanaka .................... G06N 3/10

OTHER PUBLICATIONS

Kingma, "ADAM: A Method for Stochastic Optimization", Published as a conference paper at ICLR, 2015. (Previously supplied). (Year: 2015).*

* cited by examiner

HARDWARE-ASSISTED GRADIENT OPTIMIZATION USING STREAMED GRADIENTS

CROSS-REFERENCE TO RELATED APPLICATION(S)

This application is a continuation of U.S. patent application Ser. No. 16/827,367, filed on Mar. 23, 2020, entitled "HARDWARE-ASSISTED GRADIENT OPTIMIZATION USING STREAMED GRADIENTS," the entire contents of which are hereby incorporated herein by reference.

BACKGROUND

Trained models, including neural network models, are used to perform complex tasks such as reading comprehension, language translation, image recognition, or speech recognition. Machine learning services, such as those based on Natural Language Processing (NLP), Recurrent Neural Networks (RNNs), Convolution Neural Networks (CNNs), Long Short Term Memory (LSTM) neural networks, or Gated Recurrent Units (GRUs) have been deployed to perform such complex tasks. While these types of models have been trained using various architectures and methods, there is a need for continued improvement in the underlying architectures and methods to perform training.

SUMMARY

In one example, the present disclosure relates to a method in a system comprising a memory configured to store weights associated with a neural network model comprising L layers, where L is an integer greater than one, a gradient optimizer, and a plurality of workers, where each of the plurality of workers is configured to perform a forward pass and a backward pass on any one of the L layers associated with the neural network model. The method may include during a single burst cycle moving a first set of gradients, received from each of the plurality of workers, from at least one gradient buffer to the gradient optimizer and moving weights from at least one buffer, coupled to the memory, to the gradient optimizer. The method may further include during the single burst cycle writing back the new weights, calculated by the gradient optimizer, to the memory. The method may further include during the single burst cycle transmitting the new weights, from the gradient optimizer, to each of the plurality of workers.

In another example, the present disclosure relates to a system including a memory configured to store weights associated with a neural network model comprising L layers, where L is an integer greater than one. The system may further include a plurality of workers, where each of the plurality of workers is configured to perform a forward pass and a backward pass on any one of the L layers associated with the neural network model. The system may further include a gradient optimizer coupled to each of the plurality of workers via at least one gradient buffer and further coupled to the memory via at least one buffer. The system may be configured to: (1) during a single burst cycle move a first set of gradients, received from each of the plurality of workers, from at least one gradient buffer to the gradient optimizer and move weights from the at least one buffer to the gradient optimizer, (2) during the single burst cycle write back the new weights, calculated by the gradient optimizer, to the memory, and (3) during the single burst cycle transmit the new weights, from the gradient optimizer, to each of the plurality of workers.

In a yet another example, the present disclosure relates to a method in a system comprising a memory configured to store weights associated with a neural network model comprising L layers, where L is an integer greater than one, a gradient optimizer, and a plurality of workers, where each of the plurality of workers is configured to perform a forward pass and a backward pass on any one of the L layers associated with the neural network model. The method may include during a first burst cycle each of the plurality of workers transmitting a first set of gradients associated with one of the L layers to at least one gradient buffer. The method may further include during the first burst cycle fetching weights corresponding to the neural network model from the memory into at least one buffer coupled to provide fetched weights to the gradient optimizer. The method may further include during a second burst cycle, successive to the first burst cycle, moving the first set of gradients from the at least one gradient buffer to the gradient optimizer and moving the fetched weights from the at least one buffer to the gradient optimizer. The method may further include during the second burst cycle, writing back the new weights, calculated by the gradient optimizer, to the memory. The method may further include during the second burst cycle transmitting the new weights to each of the plurality of workers. The method may further include during the second burst cycle each of the plurality of workers transmitting a second set of the gradients associated with one of the L layers to the at least one gradient buffer.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
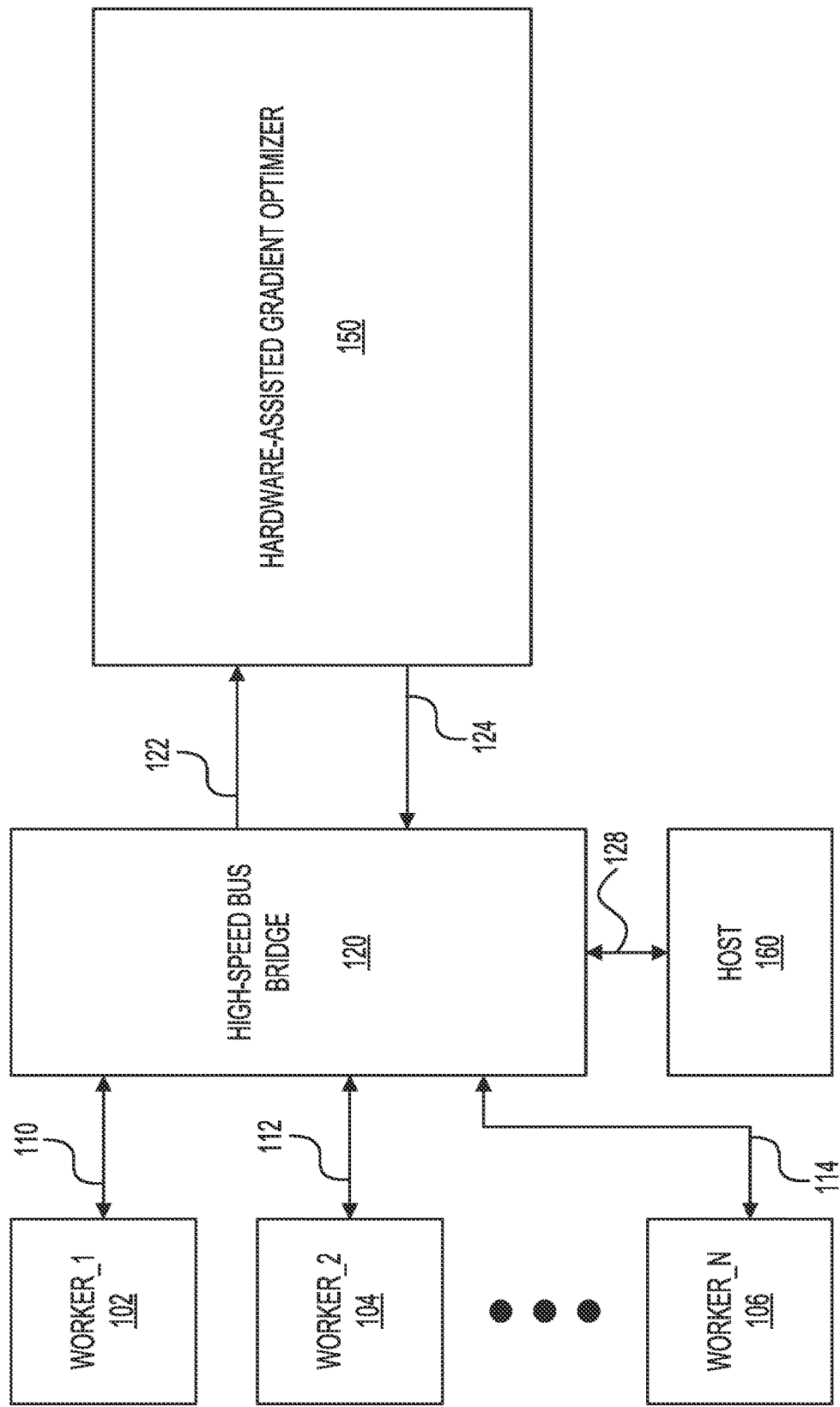
FIG. 1 shows a gradient optimization system, including a hardware-assisted gradient optimizer (HAGO), in accordance with one example.

Examples disclosed in the present disclosure relate to hardware-assisted gradient optimization using streamed gradients. Certain examples relate to distributed training of models, including neural network models, to converge models across many hardware accelerators with high throughput and accuracy. In certain example training systems, each worker (e.g., a GPU, an IPU, a DSP, or an ASIC accelerator)

takes a subset of the training data (e.g., a mini-batch) and computes the gradients, which are further averaged/reduced to update the model's parameters (e.g., weights). Weight updates are applied after the backpropagation step, which calculates the gradients. As an example, the gradient of a loss function with respect to the weights in the network (or a portion of the network) is calculated. The gradient is then fed to an optimization method that uses the gradient to update the weights to minimize the loss function. The goal with backpropagation is to update each of the weights (or at least some of the weights) in the network so that they cause the actual output to be closer to the target output, thereby minimizing the error for each output neuron and the network as a whole.

Weight updates (also referred to as gradient optimization) have been traditionally performed using either a worker-based optimizer or a host-based optimizer. Worker-based optimization implements the gradient optimization algorithm (e.g., SGD) in one of the workers. The optimizer worker performs the final all-reduce on the collected gradients before doing the weight update. The new weight is broadcasted to each worker for the next training iteration. Worker-based optimization suffers from several drawbacks. As an example, worker-based optimization systems may introduce large timing offsets among the generated gradients. In addition, the performance of such systems is constrained by the limited memory space per worker. The limited memory space poses serious challenges in implementing memory-bound optimization algorithms, such as Adaptive Moment Estimation (Adam), which requires buffering of two floating point 32-bit (FP32) momentum terms per gradient.

Host-based optimization implements the gradient optimization on the host central processing unit (CPU). Partial reduce may be performed by a subset of the workers to alleviate the bandwidth requirement between the workers and the host. Partially reduced gradients may be transferred to the host memory, and the CPU may perform the final reduce and the gradient optimization. Host-based optimization also suffers from several drawbacks. One drawback relates to the memory bandwidth bottleneck that is created due to the shared host memory being claimed by multiple running processes/tasks. Another drawback relates to the runtime bottleneck that is created due to the insufficient floating-point computing power offered by the host CPUs. In addition, one common drawback shared by both of these methods—worker-based optimization and host-based optimization—is that they both require the buffering of the entire model's gradients for each worker before the reduction and the optimization steps. The buffering of the entire model's gradients requires a very large amount of memory considering that models such as the Bidirectional Encoder Representations from Transformers (BERT)-large model has 1.36 gigabytes (GBs) of gradients generated per worker. In the context of this model, 5.44 GB of memory is required to buffer the gradients in a four-worker training cluster. The need for memory increases linearly with the number of workers. Moreover, the memory requirements for each worker may be three times the memory required for BERT when used with algorithms such as Adaptive Moment Estimation (Adam), which requires buffering of two floating point 32-bit (FP32) momentum terms per gradient.

In sum, in many training frameworks, the whole model's gradients are buffered before the gradient optimization starts. It poses both memory size and bandwidth challenges with models having tens of millions or billions of parameters. Certain examples of systems and methods described in this disclosure eliminate the buffering of full model gradients that can be several gigabytes (GBs) in size. In certain examples, the gradients are processed in a steaming-data fashion. In certain examples, only small size FIFOs are instantiated to buffer the gradient bursts to hide the memory's (e.g., Double-Data-Rate (DDR) Dynamic Random Access Memory (DRAM)) read latency. This may advantageously reduce both the memory size and the bandwidth requirements, which are the primary limiting factors of state-of-the-art distributed training systems.

In addition, as explained above, in certain systems incoming gradient streams may not be completely aligned in terms of the timing due to the clock offset among multiple workers. Certain examples in the present disclosure use multiple first-in-first-out (FIFO) buffers to align the incoming gradients so that the ones used for reduction have the same index. In addition, instead of using the worker or the host to perform the reduction and optimization operations, certain examples in the present disclosure use a separate hardware accelerator, which may be implemented by using a Field Programmable Gate Array (FPGA). The use of the hardware accelerator to perform these tasks frees up the worker's and the host's resources as well as offering more flexibility. In addition, the systems described herein may completely hide the gradient optimizer's floating-point computation cycles in the gradient's and the weight's communication cycles between the workers and optimizer. In this manner, the end-to-end runtime of the gradient optimization is determined by the bandwidth of the communication channel between the workers and the hardware-assisted gradient optimizer (HAGO).

In certain examples, the HAGO performs streaming-data gradient optimization without the host buffering the whole model's gradient for each worker, thus saving both the memory size and memory bandwidth. The HAGO may connect the workers via communicating channel(s) (e.g. the Peripheral Component Interconnect express (PCIe) buses). Each worker may be implemented using any number of graphics processing units (GPUs), computer processing units (CPUs), memory (e.g., SRAM or other types of memory), field programmable gate arrays (FPGAs), Application Specific Integrated Circuits (ASICs), Erasable and/or Complex programmable logic devices (PLDs), Programmable Array Logic (PAL) devices, or Generic Array Logic (GAL) devices.

A multi-entry FIFO (referred to as the GFIFO) may provide gradient buffering and data alignment for each worker before the reduction. The master copy of weights and the optional momentum values may be stored in the memory coupled to the HAGO. A memory interface (e.g., the DDR interface) may provide read/write access to the memory. Another multi-entry FIFO (referred to as the PFIFO), with the same depth as the GFIFO mentioned above, may provide the local parameter buffering to hide the read latency of the memory. The data output from the PFIFO may be provided to a floating-point averaging block (FP-AVG) performing the reduction. The outputs from the FP-AVG block and the PFIFO may be connected to a gradient optimizer data path (GODP) block, which may perform the necessary floating-point arithmetic to implement the gradient optimization algorithm(s). The GODP block may support multiple gradient optimization algorithms (e.g., stochastic gradient descent (SGD), SGD with momentum, Adam, RMSProp, etc.). The output of the GODP may be written back to the memory to update the weights and the momentum (optional). A transmit FIFO (referred to as TXFIFO) may provide the buffering for the new weights being broadcast back to the workers. In the example systems described in the present disclosure, there is no need to buffer the whole model's gradients in the memory because this architecture discards the gradients that just completed their weight update. In one example, the optimization algorithm may be a dual-momentum Adam algorithm, which can be represented by the following equations:

$$v_t := \beta_1 \cdot v_t + (1 - \beta_1) \cdot dw$$

$$s_t := \beta_2 \cdot s_t + (1 - \beta_2) \cdot dw^2$$

$$w := w - \frac{\alpha v_t}{\sqrt{s_t} + \epsilon}$$

where $v_t, s_t$ are the two momentums, w is the model weight, dw is the gradient, $\alpha$ is the initial learning rate, and $\epsilon$ is a tiny value for better numerical stability.

HAGO may operate on data bursts, and, in one example, each burst may consist of a constant number of incoming gradients. The current gradient burst may be buffered while the previous gradient burst is optimized along with its corresponding weights. The burst size may be configurable based on the depth of the PFIFO and the GFIFO. In the example system, all data bursts, except for the first and last ones, will have the overlap between the reception of gradients, the floating-point computations, and the transmission of the new weights.

The trained models can be deployed in cloud computing environments. Cloud computing may refer to a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly. A cloud computing model can be composed of various characteristics such as, for example, on-demand self-service, broad network access, resource pooling, rapid elasticity, measured service, and so forth. A cloud computing model may be used to expose various service models, such as, for example, Hardware as a Service ("HaaS"), Software as a Service ("SaaS"), Platform as a Service ("PaaS"), and Infrastructure as a Service ("IaaS"). A cloud computing model can also be deployed using different deployment models such as private cloud, community cloud, public cloud, hybrid cloud, and so forth.

Various machine learning services such as those based on Recurrent Neural Networks (RNNs), Convolution Neural Networks (CNNs), Long Short Term Memory (LSTM) neural networks, or Gated Recurrent Units (GRUs) may be implemented using the examples described in this disclosure. In one example, the service-related content or other information, such as words, sentences, images, videos, or other such content/information, may be translated into a vector representation. The vector representation may correspond to techniques such as RNN, CNN, LSTM, or GRU. In one example, the neural network model may comprise of many layers and each layer may be encoded as matrices or vectors of weights expressed in the form of coefficients or constants that have been obtained via off-line training of a neural network Taking the LSTM example, an LSTM network may comprise a sequence of repeating RNN layers or other types of layers. Each layer of the LSTM network may consume an input at a given time step, e.g., a layer's state from a previous time step, and may produce a new set of outputs or states. In case of using the LSTM, a single chunk of content may be encoded into a single vector or multiple vectors. As an example, a word or a combination of words (e.g., a phrase, a sentence, or a paragraph) may be encoded as a single vector. Each chunk may be encoded into an individual layer (e.g., a particular time step) of an LSTM network. An LSTM layer may be described using a set of equations, such as the ones below:

$$i_t = \sigma(W_{xi}x_t + W_{hi}h_{t-1} + W_{ci}c_{t-1} + b_i)$$

$$f_t = \sigma(W_{xf}x_t + W_{hf}h_{t-1} + W_{cf}c_{t-1} + b_f)$$

$$c_t = f_t c_{t-1} i_t \tanh(W_{xc}x_t + W_{hc}h_{t-1} + b_c)$$

$$o_t = \sigma(W_{xo}x_t + W_{ho}h_{t-1} + W_{co}c_t + b_o)$$

$$h_t = o_t \tanh(c_t)$$

In this example, inside each LSTM layer, the inputs and hidden states may be processed using a combination of vector operations (e.g., dot-product, inner product, or vector addition) and non-linear functions (e.g., sigmoids, hyperbolic, and tangents). In certain cases, the most compute intensive operations may arise from the dot products, which may be implemented using dense matrix-vector and matrix-matrix multiplication routines. In one example, the processing of the vector operations and non-linear functions may be performed in parallel.

FIG. 1 shows a gradient optimization system 100, including a hardware-assisted gradient optimizer (HAGO) 150, for training a model, in accordance with one example. Gradient optimization system 100 may include a plurality of workers (e.g., WORKER_1 102, WORKER_2 104, and WORKER_N 106) coupled via a high-speed bus bridge 120 to HAGO 150. Each of the workers (e.g., WORKER_1 102, WORKER_2 104, and WORKER_N 106) may be implemented using any number of graphics processing units (GPUs), computer processing units (CPUs), memory (e.g., SRAM or other types of memory), field programmable gate arrays (FPGAs), Application Specific Integrated Circuits (ASICs), Erasable and/or Complex programmable logic devices (PLDs), Programmable Array Logic (PAL) devices, or Generic Array Logic (GAL) devices. Each worker may carry an entire copy of the neural network model that is being trained using gradient optimization system 100. Although each worker may carry the entire copy of the neural network model, each worker may operate only on a subset of the training data (e.g., images for classification or other data samples) associated with the model. Each worker may perform a forward pass on the data to compute an error and then perform a backward pass to calculate the gradient for each parameter (e.g., each weight). Gradient optimization system 100 may further include a host 160 coupled via a bus 128 to high-speed bus bridge 120.

With continued reference to FIG. 1, in one example, high-speed bus bridge 120 may be implemented as a Peripheral Component Interconnect express (PCIe) bridge. WORKER_1 102 may be connected via a PCIe link 110 to high-speed bus bridge 120. WORKER_2 104 may be connected via a PCIe link 112 to high-speed bus bridge 120. WORKER_N 106 may be connected via a PCIe link 114 to high-speed bus bridge 120. HAGO 150 may be coupled to high-speed bus bridge 120 via bus links 122 and 124. Other types of bus bridges and bus links may also be used. In addition, instead of a bus bridge, a switching fabric may also be used. Each worker may compute gradients on a subset of the training data (e.g., a mini-batch) and provide updated gradients via high-speed bus bridge 120 to HAGO 150. HAGO 150 may perform the reduction and optimization on the gradients collected from each of the workers (e.g., WORKER_1 102, WORKER_2 104, and WORKER_N 106). HAGO 150 may operate on data bursts, and, in one example, each burst may consist of a constant number of incoming gradients. The current gradient burst may be buffered while the previous gradient burst is optimized along with its corresponding weights. Although FIG. 1 shows gradient optimization system 100 including a certain number of components, arranged in a certain manner, gradient optimization system 100 may include additional or fewer components arranged differently.

Figure 2:
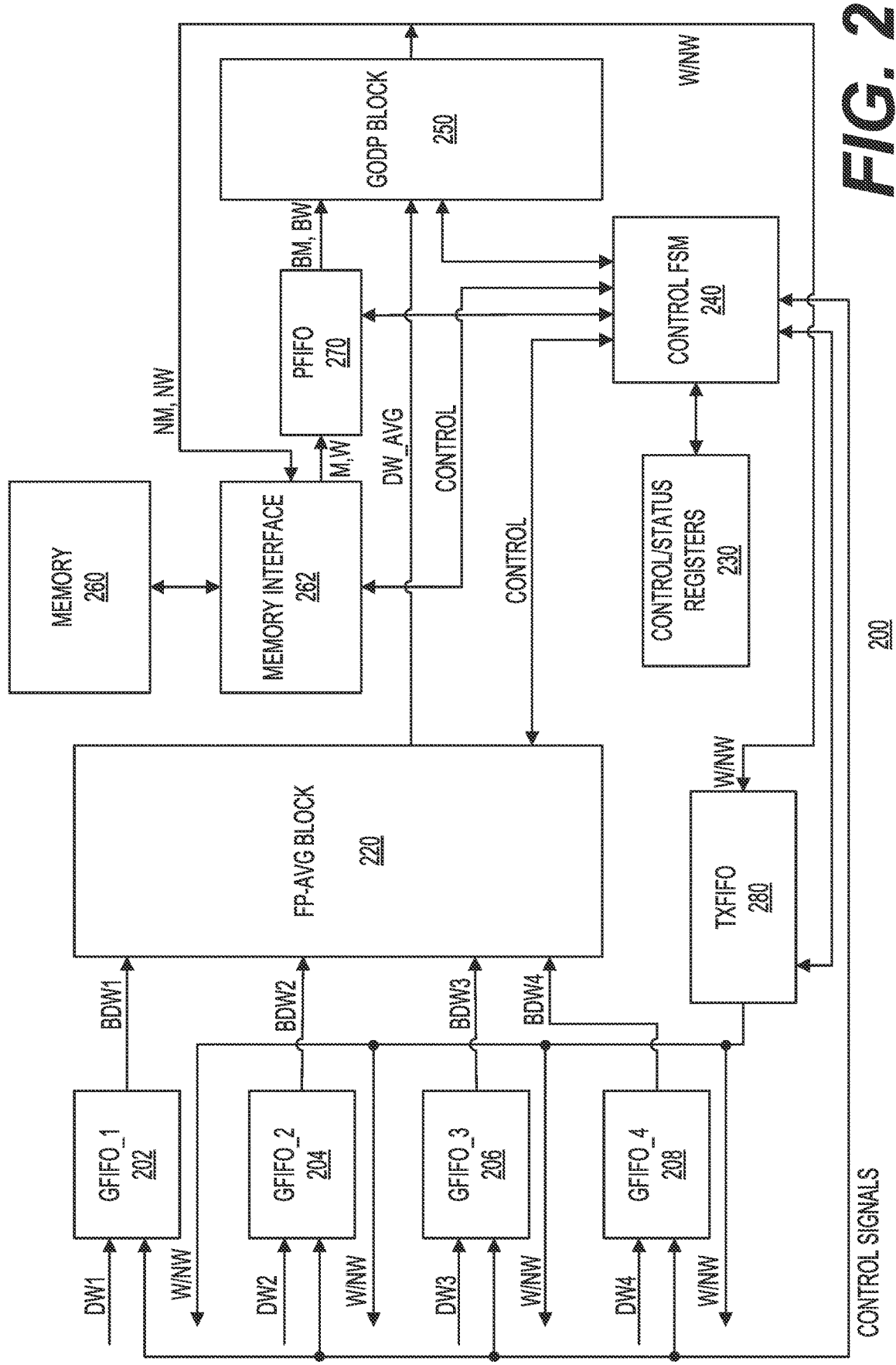
FIG. 2 shows a block diagram of a HAGO in accordance with one example.

FIG. 2 shows a block diagram of a HAGO 200 in accordance with one example. In one example, HAGO 150 of FIG. 1 may be implemented as HAGO 200 of FIG. 2. HAGO 200 may receive updated gradients from workers via a high-speed bus. The example in FIG. 2 assumes four workers coupled to HAGO 200. Updated gradients (DW1) from one of the workers may be received via a first-in-first-out block (e.g., GFIFO_1 202). Updated gradients (DW2) from another worker may be received via another first-in-first-out block (e.g., GFIFO_2 204). Updated gradients (DW3) from another worker may be received via another first-in-first-out block (e.g., GFIFO_3 206). Updated gradients (DW4) from another worker may be received via another first-in-first-out block (e.g., GFIFO_4 208). The FIFOs may be implemented as a single multi-entry FIFO or multiple single-entry FIFOs.

With continued reference to FIG. 2, HAGO 200 may further include a floating-point averaging block (e.g., FP-AVG block 220). FP-AVG block 220 may receive buffered updated gradients from the first-in-first-out blocks. As an example, FP-AVG block 220 may receive buffered updated gradients (BDW1) from GFIFO_1 202. FP-AVG block 220 may also receive buffered updated gradients (BDW2) from GFIFO_2 204. FP-AVG block 220 may also receive buffered updated gradients (BDW3) from GFIFO_3 206. FP-AVG block 220 may also receive buffered updated gradients (BDW4) from GFIFO_4 208. FP-AVG block 220 may perform a reduction on the received updated gradients. In this example, the reduction operation may include averaging the received gradients and generating DW_AVG as the output. The reduction operation is not limited to averaging. Reduction may be performed using other operations such as summation or scaled-summation. The output from FP-AVG block 220 may be provided to gradient optimizer data path (GODP) block 250, which performs the floating-point arithmetic to implement the gradient optimization algorithm. In one example, FP-AVG block 220 and GODP block 250 may be implemented as part of an FPGA.

Still referring to FIG. 2, the master copy of the weights (W) and the optional momentum (M) may be stored in memory 260. In one example, memory 260 may be implemented using Double Data Rate (DDR) Dynamic Random Access Memory (DRAM). Memory 260 may be coupled via a memory interface 262 to a first-in-first-out block (e.g., PFIFO block 270). Memory interface 262 may be a DDR interface. As shown in FIG. 2, the model's weights (W) and the optional momentum (M) may be loaded into PFIFO 270 under the control of a control finite state machine (FSM) (e.g., control FSM 240). In one example, at the same time, control FSM 240 both: (1) enables each worker to transmit the respective locally computed gradients (e.g., DW1, DW2, DW3, and DW4) to a respective GFIFO (e.g., GFIFO_1 202, GFIFO_2 204, GFIFO_3 206, and GFIFO_4 208), and (2) enables memory interface 262 to fetch the same number of parameters (e.g., weights (W)), with optional momentum, from memory 260 to PFIFO 270. Thus, in this example, control FSM 240 controls memory interface 262 to fetch the same number of weights into PFIFO 270 as the number of gradients that are injected into a GFIFO during a single burst cycle. As each of these FIFOs reach the burst size, their respective read port is activated by control FSM 240 to output the contents of the respective FIFO with a single-cycle latency. In this example, control FSM 240 enables readout of the weights from PFIFO 270 and the GFIFOs such that the data from these buffers is flushed out with the same latency. Thus, the readout of the data is fully aligned.

With continued reference to FIG. 2, this implementation ensures that the four gradient outputs (e.g., BDW1, BDW2, BDW3, and BDW4) from the respective FIFOs would have the same positioning index. FP-AVG block 220 then calculates the average of these gradients (e.g., BDW1, BDW2, BDW3, and BDW4) to generate the reduced gradients (e.g., DW_AVG), which is next processed along with the buffered weights and momentum by GODP block 250. In this example, the output of GODP block 250 may contain two parts: new weights (NW) and new momentum (NM), which are both written back to memory 260 via memory interface 262. Moreover, simultaneously new weights (NW) are injected into a transmit FIFO (TXFIFO) that sends the new weights back to the workers. In this example, control FSM 240 may control the flow of the weights to the workers via high-speed bus bridge 120. As an example, control/status registers 230 may be used to specify the timing associated with the various operations. In addition, control/status registers 230 may also be used to configure the hyperparameters (e.g., the learning rate) of the gradient optimizer.

During the readout from the respective GFIFOs and the weight updates, the next burst of gradients is written into respective GFIFOs. Similarly, the next set of weights and momentum are also fetched from memory 260 into PFIFO 270 during the readout from PFIFO 270 and weight updates. Since, in this example, memory 260 supports only a single data port shared by both read and write operations, the data width of PFIFO 270 is configured to be twice the data width of each of the GFIFOs. This way, in this example, all data bursts, except for the first one and the last one, will have the overlap between the reception of the gradients and the transmission of the new weights.

Still referring to FIG. 2, certain aspects of the operation of HAGO 200 may be controlled using control/status registers along with control FSM 240. Table 1 below shows example contents of control/status registers 230.

TABLE 1

| Register Name | Register Size | Register Description |
|---|---|---|
| ctrl_opt_mode | [1:0] | Selects the optimization algorithm type: SGD, SGD with momentum, RMSProp, Adam |
| ctrl_burst_size | [3:0] | Selects the burst size: 4'd8=>256, 4'd9=>512, 4'd10=>1024, 4'd11=>2048, 4'd12=>4096 |
| ctrl_param_num | [31:0] | Sets the size of the model's parameters |
| ctrl_init_lr | [31:0] | Sets the optimizer's initial learning rate (FP32 format) |
| ctrl_beta1 | [31:0] | Sets the optimizer's momentum coefficient (FP32 format) |

TABLE 1-continued

| Register Name | Register Size | Register Description |
|---|---|---|
| ctrl_beta2 | [31:0] | Sets the optimizer's 2nd momentum coefficient (FP32 format) |
| ctrl_is_fp16 | [0:0] | Set if the input gradient's format is FP16 format |

As shown in Table 1, the ctrl_opt_mode register allows one to specify the optimization algorithm type, which may be any one of SGD, SGD with momentum, RMSProp, or Adam. The ctrl_burst_size register allows the selection of burst size associated with each burst cycle. In this example, burst size (e.g., specified in terms of the number of gradients) may be 256 gradients, 512 gradients, 1024 gradients, 2048 gradients, or 4096 gradients. The ctrl_param_num register allows one to specify the size of the model's parameters. The ctrl_init_lr register allows one to specify the model's initial learning rate. In one example, the initial learning rate may relate to the step size of the model. As explained earlier, in one example, the optimization algorithm may be a dual-momentum Adam algorithm, which can be represented by the following equations:

$$v_t := \beta_1 \cdot v_t + (1 - \beta_1) \cdot dw$$

$$s_t := \beta_2 \cdot s_t + (1 - \beta_2) \cdot dw^2$$

$$w := w - \frac{\alpha v_t}{\sqrt{s_t} + \epsilon}$$

where $v_t, s_t$ are the two momentums, w is the model weight, dw is the gradient, $\alpha$ is the initial learning rate, and $\epsilon$ is a tiny value for better numerical stability. The ctrl_beta1 register allows one to specify the momentum's coefficient, which may control an acceleration associated with the rate at which the weights are updated. The ctrl_beta2 register allows one to specify a second momentum's coefficient, which may further control an acceleration associated with the rate at which the weights are updated. The ctrl_is_fp16 register is set if the input gradient's format is FP16 format. Although Table 1 shows a certain set of registers included as part of control/status registers 230, additional or fewer registers may be used with HAGO 200. In addition, at least some or all of the control information included in control/status registers 230 may be specified via the fields or operands associated with the instructions associated with gradient optimization using HAGO 200. Although FIG. 2 shows HAGO 200 including a certain number of components, arranged in a certain manner, HAGO 200 may include additional or fewer components arranged differently. As an example, more than four workers may be coupled to HAGO 200.

Figure 3:
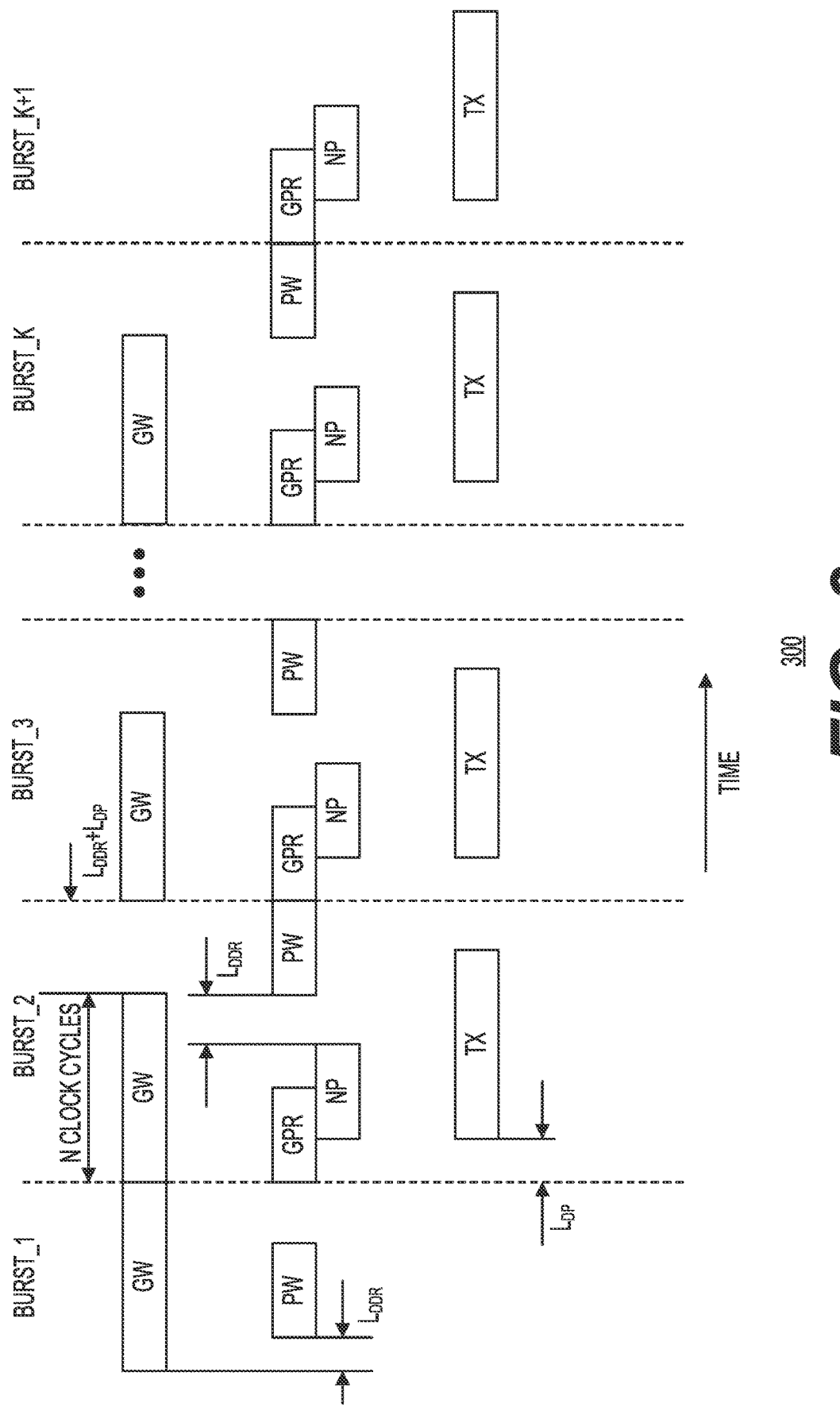
FIG. 3 shows a timing diagram associated with the HAGO of FIG. 2 in accordance with one example.

FIG. 3 shows a timing diagram 300 associated with the HAGO 200 of FIG. 2 in accordance with one example. Timing diagram 300 explains the operation of HAGO 200 in terms of bursts. Timing diagram 300 shows K+1 burst cycles, where K is a positive integer. The first burst cycle (BURST_1) and the last burst cycle (BURST_K+1) include less overlap than the other burst cycles: BURST_2 to BURST_K cycles. BURST_1 cycle includes the timing (GW) involved with the initiation of the transmission of gradients (e.g., DW1) from a worker up to the injection of the gradients into a FIFO (e.g., GFIFO_1 202 of FIG. 3) up to the burst size of the FIFO. Multiple workers (e.g., WORKER_1 102, WORKER_2 104, and WORKER_N 106 of FIG. 1) can inject the gradients into a FIFO up to the burst size of the FIFO during BURST_1 cycle. BURST_1 cycle further includes the timing (PW) involved with the initiation of the transfer of parameters (e.g., model's weights) stored in a memory (e.g., memory 260 of FIG. 2) up to the injection of the weights into PFIFO 270 of FIG. 2. As shown in FIG. 3, the transfer of weights is affected by the read latency ($L_{DDR}$) of the memory (e.g., memory 260 of FIG. 2). Thus, in BURST_1 cycle, HAGO 200 overlaps two operations: injection of the gradients into a FIFO and the fetching of the weights from the memory.

With continued reference to FIG. 3, BURST_2 cycle includes the timing (GW) involved with the initiation of the transmission of the next set of gradients (e.g., DW1) from a worker up to the injection of the gradients into a FIFO (e.g., GFIFO_1 202 of FIG. 2) up to a burst size of the FIFO. Multiple workers (e.g., WORKER_1 102, WORKER_2 104, and WORKER_N 106 of FIG. 1) can inject the gradients into a FIFO up to the burst size of the FIFO during BURST_2 cycle. While the next set of gradients are being injected into the FIFO, BURST_2 cycle also includes the computation cycles, including calculating of the average of the gradients by FP-AVG block 220 and processing of the reduced gradients along with the buffered momentum and the buffered weights (BM, BW) by GODP block 250. The timing involved as part of this operation is labeled as GPR in FIG. 3. The timing involved with writing back the new momentum and the new weights (NM, NW) output from the GODP block 250 to memory 260 is labeled as NP. BURST_2 cycle further includes an overlap of the timing involved with the transmission of new weights to the workers via TXFIFO 280. As shown in timing diagram 300 of FIG. 3, this operation is impacted by the processing latency ($L_{DP}$) of GODP block 250. BURST_2 cycle further includes the timing (PW) involved with the initiation of the transfer of the parameters (e.g., model's weights) stored in a memory (e.g., memory 260 of FIG. 2) up to the injection of the weights into PFIFO 270 of FIG. 2. As shown in FIG. 3, the transfer of weights is affected by the read latency ($L_{DDR}$) of the memory (e.g., memory 260 of FIG. 2). Thus, in BURST_2 cycle, HAGO 200 overlaps, at least partially, four operations as part of the gradient optimization: (1) injection of the gradients into a FIFO (e.g., into any of the GFIFOs), (2) readout of the gradients and the weights from the GFIFO(s) and the PFIFO, (3) writing back of the new weights and the new momentum to the memory, and (4) the transmission of the weights to the workers.

Still referring to FIG. 3, control FSM 240 continues to operate HAGO 200 in a streaming fashion, such that successive burst cycles result in the streaming of gradients through HAGO 200. Thus, BURST_3 cycle includes additional streaming of gradients and overlap of multiple operations, including overlap, at least partially, of four operations as part of the gradient optimization: (1) injection of the gradients into a FIFO (e.g., into any of the GFIFOs), (2) readout of the gradients and the weights from the GFIFO(s) and the PFIFO, (3) writing back of the new weights and the new momentum to the memory, and (4) the transmission of the new weights to the workers. Similarly, BURST_K cycle includes overlap, at least partially, of four operations as part of the gradient optimization: (1) injection of the gradients into a FIFO (e.g., into any of the GFIFOs), (2) readout of the gradients and the weights from the GFIFO(s) and the PFIFO, (3) writing back of the new weights and the new momentum to the memory, and (4) the transmission of the new weights to the workers. BURST_K+1 cycle corresponds to the last burst cycle. Thus, BURST_K+1 cycle includes less overlap than the other burst cycles: BURST_2 to BURST_K cycles. As part of BURST_K+1 cycle, three operations overlap, including: (1) readout of the gradients and the weights from the GFIFO(s) and the PFIFO, (2) writing back of the new weights and the new momentum to the memory, and (3) the transmission of the new weights to the workers.

With continued reference to FIG. 3, during each single burst cycle, HAGO 200 may operate on a gradient burst, and each gradient burst may comprise a fixed number of gradients. The number of gradients operated on during a single burst cycle corresponds to the burst size, which may be configured via control/status registers 230, as explained earlier with respect to FIG. 2.

Still referring to FIG. 3, the performance of HAGO 200 may be estimated using an equation below, which assumes that the number of bursts associated with optimizing the whole model's weight is big enough so that the overhead of the first burst cycle and the last burst cycle, (involving less overlapping), can be safely ignored. Thus, the effective weight update bandwidth ($BW_{opt}$) may be calculated using the equation:

$$BW_{opt} \approx \frac{N - (L_{dp} + L_{ddr})}{N} BW_{com},$$

where N is the number of cycles needed to inject a burst of gradients into the gradient buffer (e.g., any of GFIFOs), $L_{dp}$ is the latency of GODP block 250 of FIG. 2, and $L_{ddr}$ is the read latency of memory 260 of FIG. 2, and $BW_{com}$ is the effective communication bandwidth between a worker (e.g., any of WORKER_1 102, WORKER_2 104, and WORKER_N 106 of FIG. 1) and the gradient optimizer (e.g., HAGO 150 of FIG. 1). If the number of cycles N needed to inject a burst of gradients into the gradient buffer is sufficiently large compared with the sum of the cycles associated with the latency of GODP block 250 ($L_{dp}$) and the latency of memory 260 ($L_{ddr}$), the gradient optimization bandwidth will approximately be the same as the communication bandwidth between a worker and HAGO 200. To illustrate the improved performance of gradient optimization system 100, consider an FPGA-based HAGO that has the following specifications: number of cycles needed to inject gradients into the gradient buffer (N)=1024 cycles, the latency of the GODP block ($L_{dp}$)=40 cycles, the latency of the memory ($L_{ddr}$)=32 cycles, and the communication bandwidth between a worker and HAGO ($BW_{com}$)=3 GB/s (e.g., for PCIe Gen2×8). For this example system, the gradient optimization bandwidth was measured to be 2.79 GB/s. In an alternative example, when the depth of each of the GFIFO buffers and the PFIFO buffer was doubled; thus, doubling the burst size, the gradient optimization bandwidth was increased to 2.89 GB/s. As an example, this translates to the end-to-end gradient optimization runtime of ~480 ms to update the BERT-large model's 340 million parameters in the floating-point 32 (FP32) format. Most of the gradient optimizer's compute latency (associated with the reduce and the optimization operations) may advantageously be hidden by the communication latency between the worker and gradient optimizer, and thus boosting the gradient optimizer's performance. In addition, because both the reduce and the optimization algorithms are executed using the hardware (e.g., an FPGA), the compute latency is minimized. Moreover, instead of buffering millions of gradients, only a small number of gradients are buffered (e.g., 4K gradients).

Figure 4:
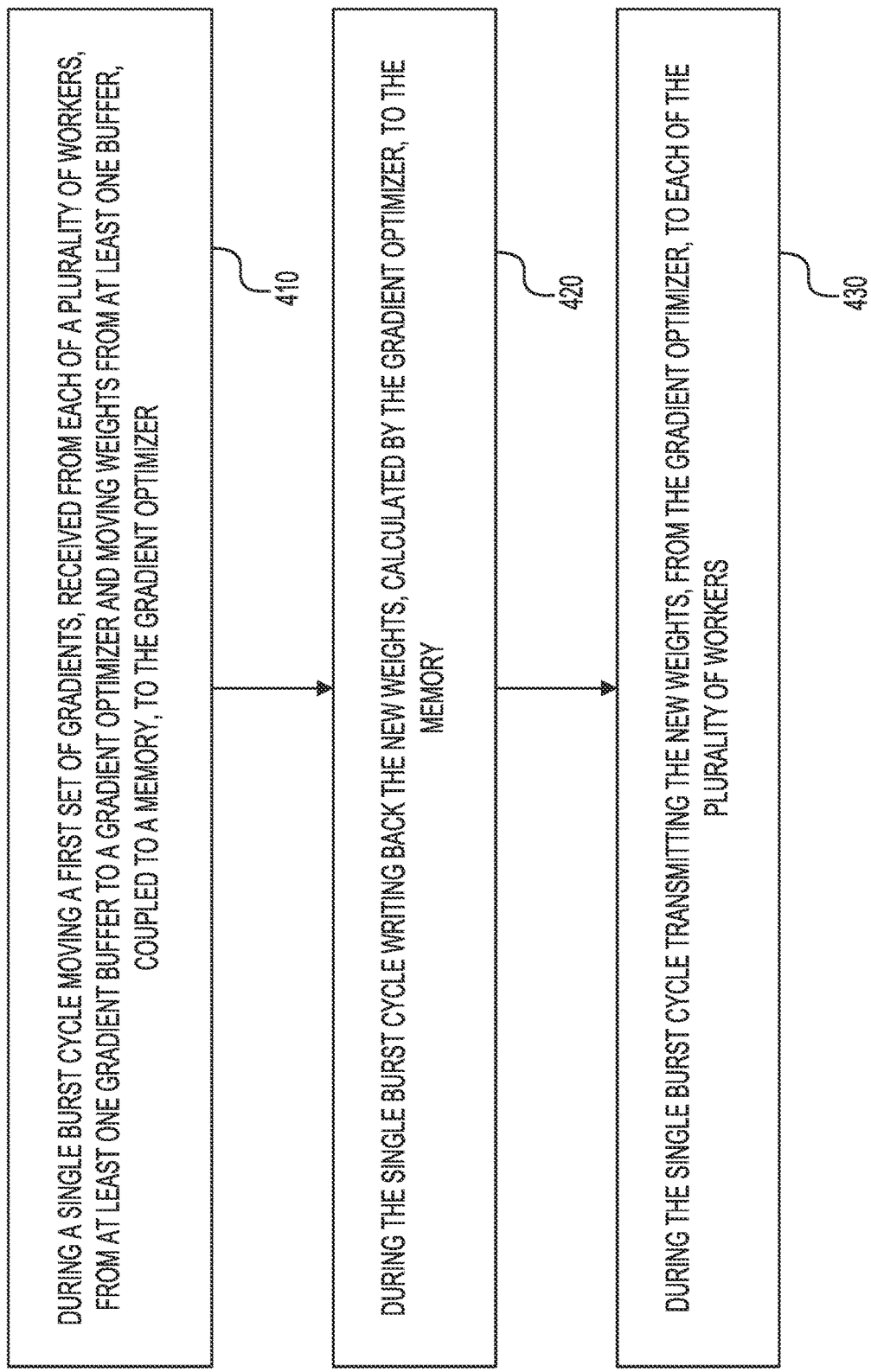
FIG. 4 shows a flow diagram of a method for hardware-assisted gradient optimization in accordance with one example.

FIG. 4 shows a flow diagram 400 of a method for hardware-assisted gradient optimization in accordance with one example. This method may be performed using gradient optimization system 150 of FIG. 1 and HAGO 200 of FIG. 2. Thus, as an example, based on control signals received from control FSM 240, steps corresponding to this method may be performed. In addition, although not shown in FIG. 2, clock signals may be used to synchronize the timing associated with the operations performed as part of this method. Step 410 may include during a single burst cycle moving a first set of gradients, received from each of a plurality of workers, from at least one gradient buffer to the gradient optimizer and moving weights from at least one buffer, coupled to the memory, to the gradient optimizer. As used in the present disclosure, the term moving may include copying or any other such operation. In this example, this step may correspond to BURST_2 cycle performed using gradient optimization system 150 and HAGO 200. Step 410 corresponds to the timing involved with the injection of the gradients (e.g., DW1) from a worker into a FIFO (e.g., GFIFO_1 202 of FIG. 2) up to a burst size of the FIFO. Multiple workers (e.g., WORKER_1 102, WORKER_2 104, and WORKER_N 106 of FIG. 1) can inject the gradients into a FIFO up to the burst size of the FIFO during the BURST_2 cycle. As explained earlier, while the next set of gradients are being injected into the FIFO, BURST_2 cycle also includes the computation cycles, including calculating the average of the gradients by FP-AVG block 220 and processing of the reduced gradients along with the buffered momentum and the buffered weights (BM, BW) by GODP block 250. The timing involved as part of this operation is labeled as GPR in FIG. 3.

Step 420 may include during the single burst cycle writing back the new weights, calculated by the gradient optimizer, to the memory. In this example, step 420 corresponds to the timing involved with writing back the new momentum and the new weights (NM, NW) output from the GODP block 250 to memory 260 (labeled as NP in FIG. 3).

Step 430 may include during the single burst cycle (e.g., BURST_2 cycle) transmitting the new weights, from the gradient optimizer, to each of the plurality of workers. In this example, step 430 corresponds to the timing involved with the transmission of new weights to the workers via TXFIFO 280 (labeled as TX in FIG. 3). As shown in the timing diagram 300, steps 420 and 430 can be overlapped in time and thus they are not performed sequentially and instead can be performed in parallel. Although FIG. 4 describes a certain number of steps performed in a certain order, additional or fewer steps in a different order may be performed.

Figure 5:
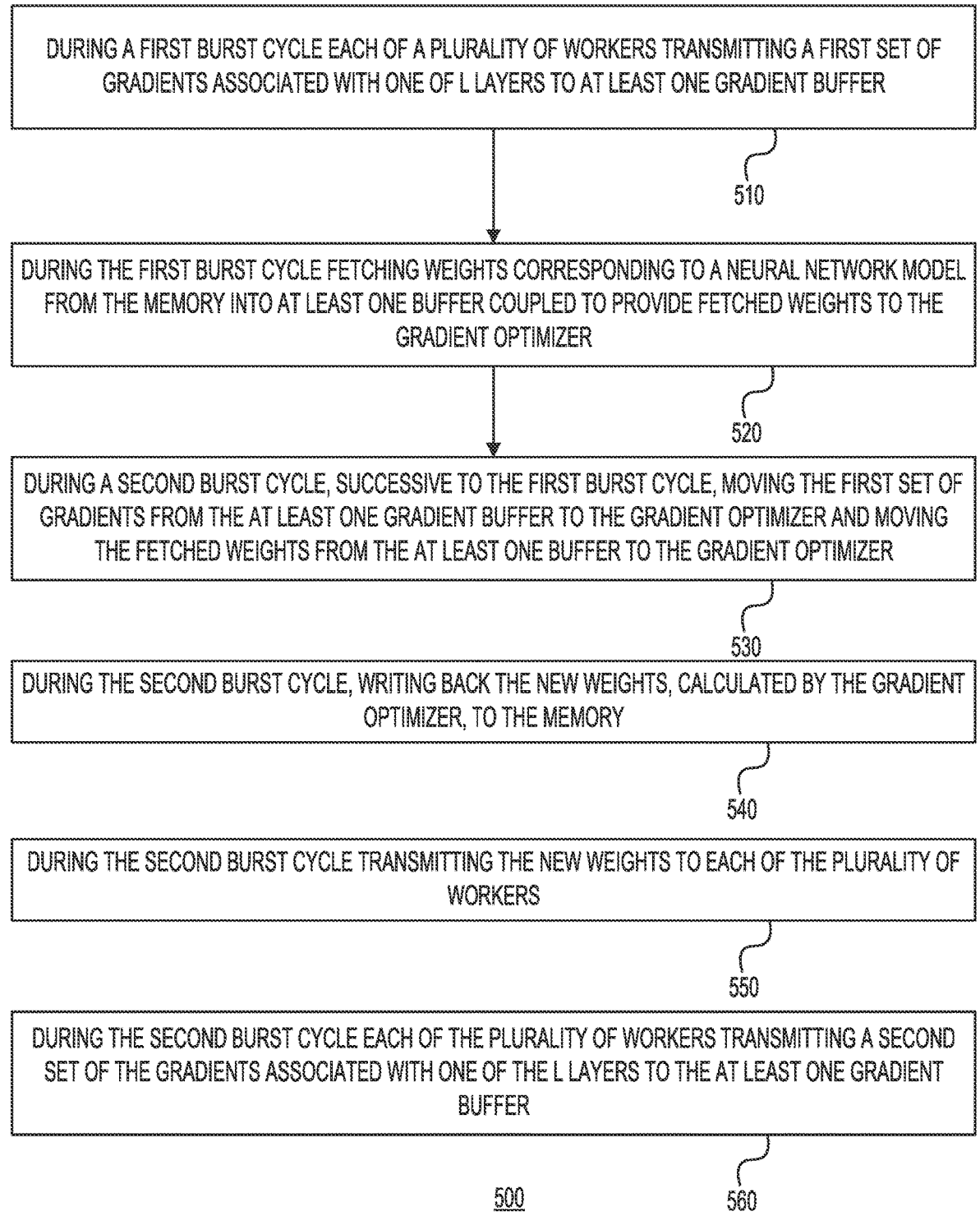
FIG. 5 shows a flow diagram of another method for hardware-assisted gradient optimization in accordance with one example.

FIG. 5 shows a flow diagram 500 of a method for hardware-assisted gradient optimization in accordance with one example. This method may be performed using gradient optimization system 150 of FIG. 1 and HAGO 200 of FIG. 2. Thus, as an example, based on control signals received from control FSM 240, steps corresponding to this method may be performed. In addition, although not shown in FIG. 2, clock signals may be used to synchronize the timing associated with the operations performed as part of this method. Step 510 may include during a first burst cycle (e.g., BURST_1 cycle of FIG. 3) each of the plurality of workers transmitting a first set of gradients associated with one of the L layers to at least one gradient buffer. In this example, step 510 corresponds to the timing involved with the injection of the gradients (e.g., DW1) from a worker into a FIFO (e.g., GFIFO_1 202 of FIG. 2) up to a burst size of the FIFO. Multiple workers (e.g., WORKER_1 102, WORKER_2

104, and WORKER_N 106 of FIG. 1) can inject the gradients into a FIFO up to the burst size of the FIFO during BURST_1 cycle.

Step 520 may include during the first burst cycle (e.g., BURST_1 cycle of FIG. 3) fetching weights corresponding to the neural network model from the memory into at least one buffer coupled to provide fetched weights to the gradient optimizer. In this example, step 520 corresponds to the timing (PW) involved with the initiation of the transfer of parameters (e.g., model's weights) stored in a memory (e.g., memory 260 of FIG. 2) up to the injection of the weights into PFIFO 270 of FIG. 2. As shown in FIG. 3, the transfer of weights is affected by the read latency ($L_{DDR}$) of the memory (e.g., memory 260 of FIG. 2). Thus, in in a single burst cycle (e.g., BURST_1 cycle of FIG. 3), HAGO 200 may overlap two operations: injection of the gradients into a FIFO and the fetching of the weights from the memory.

Step 530 may include during a second burst cycle, successive to the first burst cycle, moving the first set of gradients from the at least one gradient buffer to the gradient optimizer and moving the fetched weights from the at least one buffer to the gradient optimizer. In this example, this step may correspond to BURST_2 cycle performed using gradient optimization system 150 and HAGO 200. In this example, step 530 corresponds to the timing involved with the injection of the gradients (e.g., DW1) from a worker into a FIFO (e.g., GFIFO_1 202 of FIG. 2) up to a burst size of the FIFO. Multiple workers (e.g., WORKER_1 102, WORKER_2 104, and WORKER_N 106 of FIG. 1) can inject the gradients into a FIFO up to the burst size of the FIFO during BURST_2 cycle. As explained earlier, while the next set of gradients are being injected into the FIFO, BURST_2 cycle also includes the computation cycles, including calculating of the average of the gradients by FP-AVG block 220 and processing of the reduced gradients along with the buffered momentum and the buffered weights (BM, BW) by GODP block 250. The timing involved as part of this operation is labeled as GPR in FIG. 3.

Step 540 may include during the second burst cycle (e.g., BURST_2 cycle of FIG. 3), writing back the new weights, calculated by the gradient optimizer, to the memory. In this example, step 540 corresponds to the timing involved with writing back the new momentum and the new weights (NM, NW) output from the GODP block 250 to memory 260 (labeled as NP in FIG. 3).

Step 550 may include during the second burst cycle (e.g., BURST_2 cycle of FIG. 3) transmitting the new weights to each of the plurality of workers. In this example, step 550 corresponds to the timing involved with the transmission of new weights to the workers via TXFIFO 280 (labeled as TX in FIG. 3).

Step 560 may include during the second burst cycle (e.g., BURST_2 cycle of FIG. 3) each of the plurality of workers transmitting a second set of the gradients associated with one of the L layers to the at least one gradient buffer. In this example step 560 includes the timing involved with the injection of the gradients into a FIFO (e.g., GFIFO_1 202 of FIG. 2) up to a burst size of the FIFO. Multiple workers (e.g., WORKER_1 102, WORKER_2 104, and WORKER_N 106 of FIG. 1) can inject the gradients into a FIFO up to the burst size of the FIFO during the BURST_2 cycle. Although FIG. 5 describes a certain number of steps performed in a certain order, additional or fewer steps in a different order may be performed.

In conclusion, the present disclosure relates to a method in a system comprising a memory configured to store weights associated with a neural network model comprising L layers, where L is an integer greater than one, a gradient optimizer, and a plurality of workers, where each of the plurality of workers is configured to perform a forward pass and a backward pass on any one of the L layers associated with the neural network model. The method may include during a single burst cycle moving a first set of gradients, received from each of the plurality of workers, from at least one gradient buffer to the gradient optimizer and moving weights from at least one buffer, coupled to the memory, to the gradient optimizer. The method may further include during the single burst cycle writing back the new weights, calculated by the gradient optimizer, to the memory. The method may further include during the single burst cycle transmitting the new weights, from the gradient optimizer, to each of the plurality of workers.

The method may further include, during each of successive burst cycles, providing gradients from the at least one buffer to the gradient optimizer such that the successive burst cycles result in streaming of gradients through the gradient optimizer. During each single burst cycle the gradient optimizer may operate on a gradient burst, and where each gradient burst may comprise a fixed number of gradients. During each single burst cycle the gradient optimizer may operate on a gradient burst having a burst size related to number of gradients in each gradient burst, and the burst size may be configurable.

The gradient optimizer may be configured to operate only on gradients buffered in the at least one gradient buffer, and where gradients buffered in the at least one gradient buffer are discarded after processing by the gradient optimizer. The system may further include a reduction block coupled to provide reduced gradients to the gradient optimizer. The gradient optimizer may be configured to implement any one of a plurality of optimization algorithms, where the plurality of optimization algorithms may comprise stochastic gradient descent (SGD) algorithm, SGD with momentum algorithm, and adaptive moment estimation algorithm.

In another example, the present disclosure relates to a system including a memory configured to store weights associated with a neural network model comprising L layers, where L is an integer greater than one. The system may further include a plurality of workers, where each of the plurality of workers is configured to perform a forward pass and a backward pass on any one of the L layers associated with the neural network model. The system may further include a gradient optimizer coupled to each of the plurality of workers via at least one gradient buffer and further coupled to the memory via at least one buffer. The system may be configured to: (1) during a single burst cycle move a first set of gradients, received from each of the plurality of plurality of workers, from at least one gradient buffer to the gradient optimizer and move weights from the at least one buffer to the gradient optimizer, (2) during the single burst cycle write back the new weights, calculated by the gradient optimizer, to the memory, and (3) during the single burst cycle transmit the new weights, from the gradient optimizer, to each of the plurality of workers.

During each of successive burst cycles the system may further be configured to provide gradients from the at least one buffer to the gradient optimizer such that the successive burst cycles result in streaming of gradients through the gradient optimizer, and the gradient optimizer may be implemented using a field programmable gate array (FPGA). During each single burst cycle the gradient optimizer may be configured to operate on a gradient burst, and each gradient burst may comprise a fixed number of gradients. During each single burst cycle the gradient optimizer may be configured to operate on a gradient burst having a burst size related to number of gradients in each gradient burst, and the burst size may be configurable.

The gradient optimizer may be configured to operate only on gradients buffered in the at least one gradient buffer, and the gradients buffered in the at least one gradient buffer may be discarded after processing by the gradient optimizer. The system may further comprise a reduction block coupled to provide reduced gradients to the gradient optimizer. The gradient optimizer may be configured to implement any one of a plurality of optimization algorithms, where the plurality of optimization algorithms may comprise stochastic gradient descent (SGD) algorithm, SGD with momentum algorithm, and adaptive moment estimation algorithm.

In a yet another example, the present disclosure relates to a method in a system comprising a memory configured to store weights associated with a neural network model comprising L layers, where L is an integer greater than one, a gradient optimizer, and a plurality of workers, where each of the plurality of workers is configured to perform a forward pass and a backward pass on any one of the L layers associated with the neural network model. The method may include during a first burst cycle each of the plurality of workers transmitting a first set of gradients associated with one of the L layers to at least one gradient buffer. The method may further include during the first burst cycle fetching weights corresponding to the neural network model from the memory into at least one buffer coupled to provide fetched weights to the gradient optimizer. The method may further include during a second burst cycle, successive to the first burst cycle, moving the first set of gradients from the at least one gradient buffer to the gradient optimizer and moving the fetched weights from the at least one buffer to the gradient optimizer. The method may further include during the second burst cycle, writing back the new weights, calculated by the gradient optimizer, to the memory. The method may further include during the second burst cycle transmitting the new weights to each of the plurality of workers. The method may further include during the second burst cycle each of the plurality of workers transmitting a second set of the gradients associated with one of the L layers to the at least one gradient buffer.

The method may further include, during a third burst cycle, successive to the second burst cycle, each of the plurality of workers transmitting a third subset of the gradients associated with one of the L layers to the at least one gradient buffer such that successive burst cycles result in streaming of gradients through the gradient optimizer. During each burst cycle the gradient optimizer may operate on a gradient burst, and each gradient burst may comprise a fixed number of gradients. During each burst cycle the gradient optimizer may operate on a gradient burst having a burst size related to number of gradients in each gradient burst, and the burst size may be configurable.

The gradient optimizer may be configured to operate only on gradients buffered in the at least one gradient buffer, and gradients buffered in the at least one gradient buffer may be discarded after processing by the gradient optimizer. As part of the method, the moving the first set of gradients from the at least one gradient buffer to the gradient optimizer and moving the fetched weights from the at least one buffer to the gradient optimizer may be aligned in time.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with, transmission media. Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A method comprising:
   during a single burst cycle, receiving gradients from each of a plurality of workers, into a predetermined number of gradient buffers associated with a gradient optimizer;
   during the single burst cycle, providing the received gradients to a reduction block to generate reduced gradients;
   during the single burst cycle, providing the reduced gradients to a gradient optimizer data path associated with the gradient optimizer;
   during the single burst cycle, moving weights from at least one buffer, coupled to a memory, to the gradient optimizer;
   during the single burst cycle writing back new weights, calculated by the gradient optimizer, to the memory; and
   during the single burst cycle transmitting the new weights from the gradient optimizer to each of the plurality of workers, wherein during the single burst cycle the gradient optimizer operates on a gradient burst having a burst size equal to a fixed number of gradients.

2. The method of claim 1, wherein successive burst cycles result in streaming of gradients through the gradient optimizer.

3. The method of claim 1, wherein the fixed number of gradients is dependent at least upon a selected common depth of the predetermined number of gradient buffers.

4. The method of claim 3, wherein the at least one buffer, coupled to the memory, has a selected depth equal to or greater than the selected common depth of the predetermined number of gradient buffers.

5. The method of claim 1, wherein during each burst cycle, the gradient optimizer is configured to operate only on gradients buffered in the predetermined number of gradient buffers.

6. The method of claim 5, wherein the gradients buffered in the predetermined number of gradient buffers are discarded after processing by the gradient optimizer.

7. The method of claim 1, wherein the gradient optimizer is configured to implement any one of a plurality of optimization algorithms, wherein the plurality of optimization algorithms comprises stochastic gradient descent (SGD) algorithm, SGD with momentum algorithm, and adaptive moment estimation algorithm.

8. A system comprising:
   a memory coupled to at least one buffer;
   a gradient optimizer coupled to the memory via the at least one buffer,
   wherein the system is configured to:
      during a single burst cycle, receiving gradients from each of a plurality of workers, into a predetermined number of gradient buffers associated with the gradient optimizer,
      during the single burst cycle, provide the received gradients to a reduction block to generate reduced gradients,
      during the single burst cycle, provide the reduced gradients to a gradient optimizer data path associated with the gradient optimizer,
      during the single burst cycle, move weights from the at least one buffer, coupled to the memory, to the gradient optimizer,
      during the single burst cycle write back new weights, calculated by the gradient optimizer, to the memory, and
      during the single burst cycle transmit the new weights from the gradient optimizer to each of the plurality of workers, wherein during the single burst cycle the gradient optimizer operates on a gradient burst having a burst size equal to a fixed number of gradients.

9. The system of claim 8, wherein successive burst cycles result in streaming of gradients through the gradient optimizer.

10. The system of claim 8, wherein the fixed number of gradients is dependent at least upon a selected common depth of the predetermined number of gradient buffers.

11. The system of claim 10, wherein the at least one buffer, coupled to the memory, has a selected depth equal to or greater than the selected common depth of the predetermined number of gradient buffers.

12. The system of claim 8, wherein during each burst cycle, the gradient optimizer is configured to operate only on gradients buffered in the predetermined number of gradient buffers.

13. The system of claim 12, wherein the gradients buffered in the predetermined number of gradient buffers are discarded after processing by the gradient optimizer.

14. The system of claim 8, wherein the gradient optimizer is configured to implement any one of a plurality of optimization algorithms, wherein the plurality of optimization algorithms comprises stochastic gradient descent (SGD) algorithm, SGD with momentum algorithm, and adaptive moment estimation algorithm.

15. A method for operating a system comprising a memory configured to store weights associated with a neural network model comprising L layers, wherein L is an integer greater than one, a gradient optimizer, and a plurality of workers, wherein each of the plurality of workers is configured to perform a forward pass and a backward pass on any one of the L layers associated with the neural network model, the method comprising:
   during a single burst cycle, receiving gradients from each of the plurality of workers, into a predetermined number of gradient buffers associated with the gradient optimizer;
   during the single burst cycle, providing the received gradients to a reduction block to generate reduced gradients;
   during the single burst cycle, providing the reduced gradients to a gradient optimizer data path associated with the gradient optimizer;
   during the single burst cycle, moving weights from at least one buffer, coupled to the memory, to the gradient optimizer;
   during the single burst cycle writing back new weights, calculated by the gradient optimizer, to the memory; and
   during the single burst cycle transmitting the new weights from the gradient optimizer to each of the plurality of workers, wherein during the single burst cycle the gradient optimizer operates on a gradient burst having a burst size equal to a fixed number of gradients.

16. The method of claim 15, wherein successive burst cycles result in streaming of gradients through the gradient optimizer.

17. The method of claim 16, wherein the fixed number of gradients is dependent at least upon a selected common depth of the predetermined number of gradient buffers, and wherein the at least one buffer, coupled to the memory, has a selected depth equal to or greater than the selected common depth of the predetermined number of gradient buffers.

18. The method of claim 16, wherein during each burst cycle, the gradient optimizer is configured to operate only on gradients buffered in the predetermined number of gradient buffers.

19. The method of claim 18, wherein the gradients buffered in the predetermined number of gradient buffers are discarded after processing by the gradient optimizer.

20. The method of claim 15, wherein the gradient optimizer is configured to implement any one of a plurality of optimization algorithms, wherein the plurality of optimization algorithms comprises stochastic gradient descent (SGD) algorithm, SGD with momentum algorithm, and adaptive moment estimation algorithm.

* * * * *